United States Patent [19] [11] Patent Number: 4,956,913
Eck [45] Date of Patent: Sep. 18, 1990

[54] PIN ALIGNMENT METHOD

[75] Inventor: Michael P. Eck, Wellsville, Pa.

[73] Assignee: E. I. du Pont de Nemours and Company, Wilmington, Del.

[21] Appl. No.: 418,833

[22] Filed: Oct. 10, 1989

Related U.S. Application Data

[62] Division of Ser. No. 192,689, May 11, 1988.

[51] Int. Cl.$^5$ ............................................. H01R 43/00
[52] U.S. Cl. ....................................... 29/884; 29/428; 29/468; 29/759; 29/876
[58] Field of Search ................. 29/428, 759, 760, 876, 29/746, 468, 884

[56] References Cited

U.S. PATENT DOCUMENTS

| | | | |
|---|---|---|---|
| 3,276,854 | 10/1966 | Felker et al. | 29/428 X |
| 3,414,962 | 12/1968 | Altamura | 29/428 |
| 3,468,024 | 9/1969 | Yonkers | 29/428 X |
| 3,574,919 | 4/1971 | Reppert | 29/759 X |
| 3,664,016 | 5/1972 | Sevc et al. | 29/760 X |
| 4,142,286 | 3/1979 | Knuth et al. | 29/759 X |
| 4,567,654 | 2/1986 | Kloenne et al. | 29/876 |

FOREIGN PATENT DOCUMENTS

1025127 4/1966 United Kingdom ................... 29/760

Primary Examiner—Carl E. Hall
Assistant Examiner—Carl J. Arbes

[57] ABSTRACT

An apparatus and method for assembling electrical connector components, including headers, connectors, and terminals, to circuit bearing substrates functions to align the terminal pins of a connector or header into a preferred position and install an annular solder preform onto each terminal pin. The pin alignment apparatus includes movable jaw plates the define a variable size aperture for encompassing each of a plurality of terminal pins, including terminal pins that are bent or skewed relative to an intended position. A carrier plate overlies the jaw plates and includes a plurality of cavities for receiving solder preforms to be installed over each of the terminal pins. The jaw plates are positioned over the terminal pins and moved to a closed position to align all the terminal pins, including any bent or skewed terminal pins, to an intended alignment. The pin alignment apparatus is advanced along the pins until the solder preforms are positioned adjacent the lower portions of the terminal pins at which time the jaw plates are repositioned to release the solder preforms. The present invention advantageously provides for the rapid alignment of the terminal pins of a header or connector and the reliable and efficient installation of solder preforms in such a way that deposition of solder on the contact zones of the terminal pins is minimized.

1 Claim, 8 Drawing Sheets

PIN ALIGNMENT METHOD

This is a division of application Ser. No. 07/192,689, filed May 11, 1988.

BACKGROUND OF THE INVENTION

The present invention relates to an apparatus and method for mechanically and electrically assembling connector components, such as headers, connectors, and terminal pins, to circuit bearing substrates and, more particularly, to apparatus and method for ensuring the mechanical alignment of terminal pins preparatory to electrical connection of the pins to circuit board traces.

Electrical connectors and headers typically include a housing that supports an array of pins or receptacles with each pin or receptacle having a solder tail that extends rearwardly of the housing to define a corresponding array or field of terminal pins. The printed circuit board to which the connector or header is to be mounted is provided with a corresponding field of holes that corresponds in number and organization with the terminal pin field so that each hole in the printed circuit board accepts a corresponding terminal pin with the distal end of the terminal pins extending a selected distance from the printed circuit board on the side opposite the housing. In general, the distance that the remote end of the terminal pin extends from the surface of the printed circuit board is sufficient to accommodate a solder joint. Usually, soldering is accomplished by wave soldering all the exposed terminal pins to their respective conductive traces on the printed circuit board.

In some applications, it is desirable to mount a header on both sides of the printed circuit board so that the printed circuit board can be engaged from one or both sides. In this type of double-sided application, a header is fabricated with pins having relatively long solder tails. The terminal pin tails are passed through the array of corresponding holes in the printed circuit board with their remote ends extending a selected distance from the opposite side of the printed circuit board. A second housing, termed a shroud, includes an array of holes that correspond in number and organization with the terminal pins extending from the printed circuit board. The shroud is mounted over the terminal pins to effectively define another header on the side of the printed circuit board opposite the first header. In this latter double-sided application, wave soldering cannot be used to effect the soldering of the terminal pins to their respective conductive traces on the printed circuit board since wave soldering would "tin" the entire, exposed portions of each terminal pin. Any solder deposit or residue on the surface of the terminal pin, particularly in the contact zone at the opposite ends of the pin, represents an unacceptable contamination of the typically gold-plated terminal pin surface. In dual-header type applications, soldering of the exposed terminal pins to their conductive traces can be accomplished by hand soldering or, in more sophisticated systems, by placing an annular solder preform over each terminal pin and positioning the solder preform at the base of each terminal pin where it emerges from its bore in the printed circuit board. Once all the solder preforms are positioned, electrical connection is effected by heating the solder preforms to effect the conductive connection of the parts. In general, heating is accomplished with vapor phase reflow devices, ovens, and radiate heat sources.

Various systems have been developed to place the annular solder preform on each terminal pin in the terminal pin field. For example, a horizontally aligned loading tray is provided with a plurality of clearance bores that correspond in number and position with the terminal pins. The annular solder preforms are arranged in rows and columns on the tray in such a way that a solder preform is positioned concentrically over each of the holes. The header is placed on the tray so that each terminal pin passes through a respective solder preform. The loading tray and header are then inverted so that solder preforms slide along their respective terminal pin to provide with a solder preform positioned at the base of each terminal pin.

When each of the terminal pins is straight and properly aligned relative to the other terminal pins, the tip of the terminal pin passes through the annular solder preform without undue surface-to-surface contact that could lead to solder transfer between the preform and the terminal pin. One problem associated with this type of solder preform installation technique is that a bent or skewed terminal pin can impale a solder preform or contact and slide against the preform in such a way that solder is wiped or transferred from the preform onto the typically gold-plated surfaces of the terminal pin. In a worse case situation, the tip of the terminal pin can sever the solder preform as well as subject the terminal pin to compressive forces that can deform the terminal pin or adversely affect its mechanical mounting.

SUMMARY OF THE INVENTION

In view of the above, it is an object of the present invention to provide an apparatus and method for reliably aligning terminal pins relative to a desired position.

It is a further object of the present invention to provide an apparatus and method for reliably mounting a selected component to each terminal pin in a field of terminal pins.

It is a further object of the present invention to provide an apparatus and method for reliably mounting a solder preform to each terminal pin in a field of terminal pins.

It is a further object of the present invention to provide an apparatus and method for reliably fabricating double-sided header applications for printed circuit boards.

In view of these objects, and others, the present invention provides apparatus and method useful in the assembly of electrical connector components, including headers, connectors, and terminals, to circuit bearing substrates. A pin alignment and component installation apparatus functions to align the terminal pins of a connector or header into a preferred position and install a component, such as a solder preform, onto each terminal pins. In the preferred embodiment, first and second jaw plates are provided with through bores that correspond in number and arrangement with the terminal pins upon which a preform is to be installed. The jaw plates are mounted in an overlying relationship and slidably mounted relative one another to control the size and an aperture for embracing and constraining each of the terminal pins. A preform carrier plate overlies the jaw plates and includes a plurality of apertures for receiving solder preforms to be installed over each of the terminal pins. The jaw plates are positioned over the terminal pins and moved to a closed position to align all the terminal pins, including any bent or skewed terminal pins, to an intended alignment. The pin alignment apparatus is advanced along the pins until the solder preforms are positioned adjacent the lower portions of the terminal pins at which time the jaw plates are repositioned to release the solder preforms.

The apparatus and method of the present invention advantageously provides for the alignment of the terminal pins of a header or connector and the reliable and efficient installation of solder preforms in such a way that the possibility of depositing solder onto the surface of the terminal pins is minimized.

Other objects and further scope of applicability of the present invention will become apparent from the detailed description to follow, taken in conjunction with the accompanying drawings, in which like parts are designated by like reference characters.

DESCRIPTION OF THE PREFERRED EMBODIMENT

Figure 1:
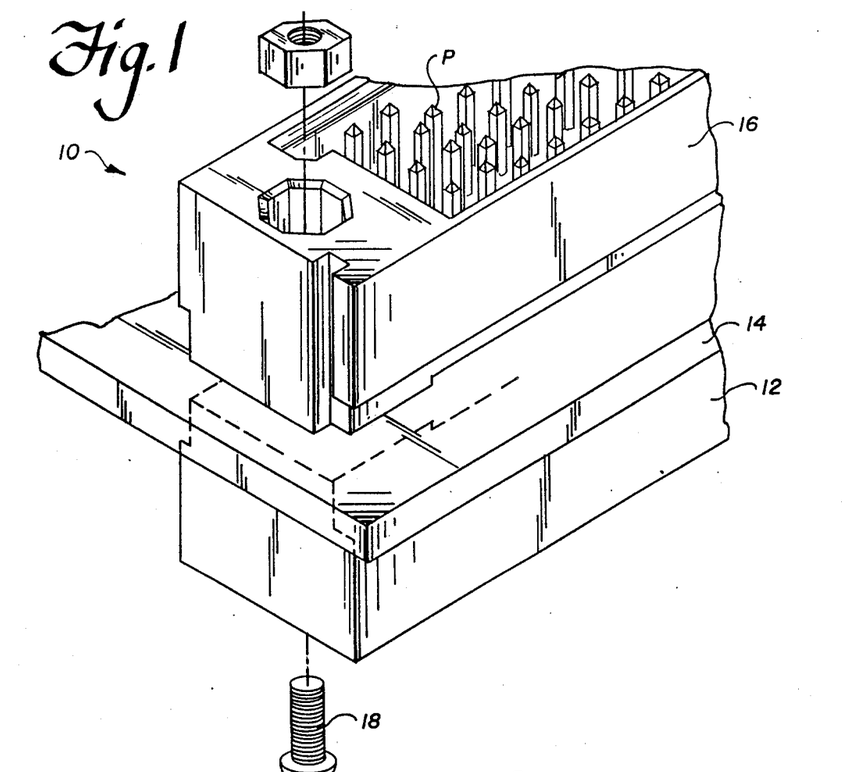
FIG. 1 is a partial perspective view of a double-sided header installation on a printed circuit board.
Figure 2:
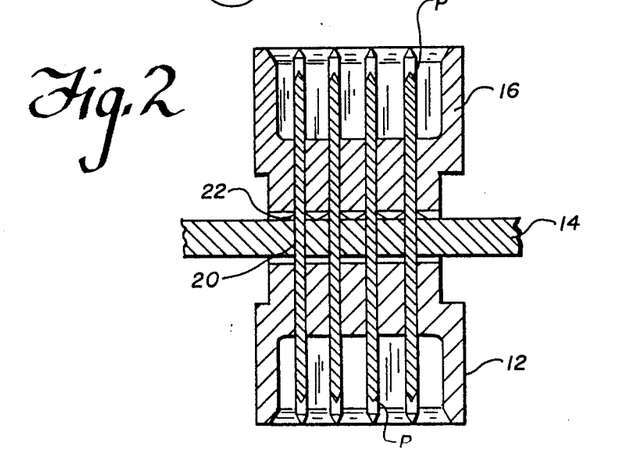
FIG. 2 is a partial cross-sectional view of the double-sided header installation of FIG. 1.

The present invention in its preferred form is used in the mounting of electrical headers to a printed circuit board to provide a double-sided mounting as shown in FIGS. 1 and 2 and as designated generally therein by the reference character 10. As shown, a first header 12 is mounted to the under side of a printed circuit board 14 and another header 16 is mounted on the upper, opposite side of the printed circuit board 14 with the headers 12 and 16 secured to the printed circuit board 14 by suitable fasteners 18. As shown in the detail of FIG. 2, a plurality of pins P extend from the header 12 through corresponding through bores 20 in the printed circuit board 14 to the header 16. The opposite ends of the pins P function as contact zones for mating connectors (not shown). The pins P are soldered at a point intermediate their ends to respective conductive traces (not shown) on the printed circuit board 14, as indicated generally at 22. Suitable headers and pins include the HPC-XXXX Interconnect System marketed by DuPont Electronics of New Cumberland, PA 17070, these headers available with three- or four-row rectangular matrices of square, gold-plated pins mounted on 0.100 inch (2.54 mm.) centers.

Figure 3:
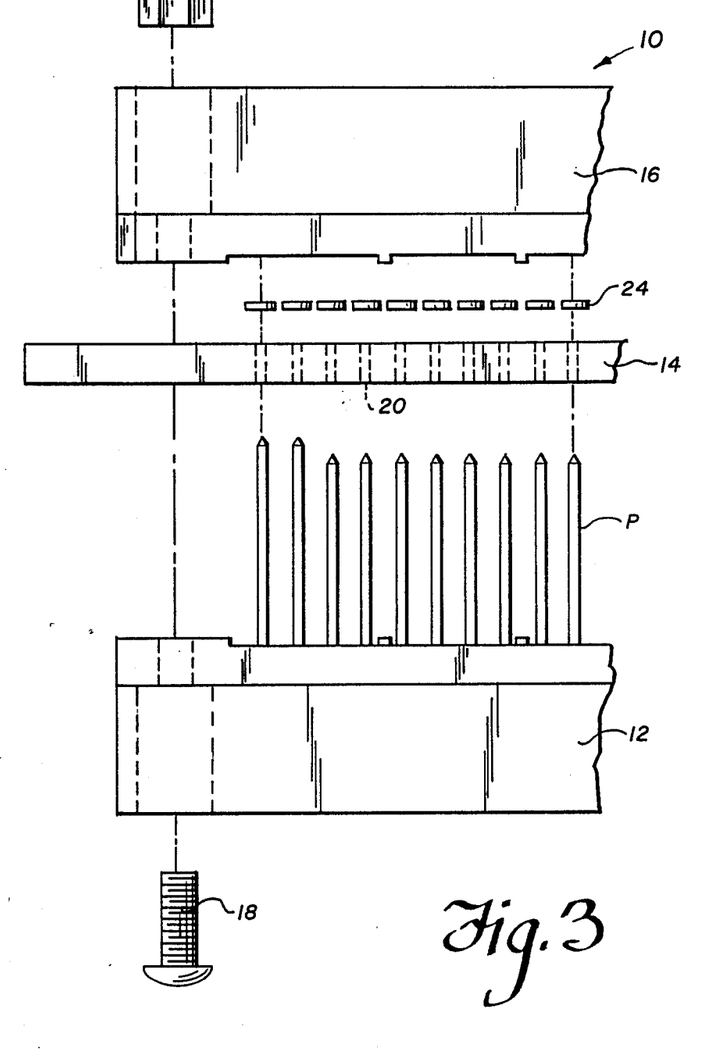
FIG. 3 is an exploded frontal view of the various components of the double-sided header installation shown in FIGS. 1 and 2.
Figure 4:
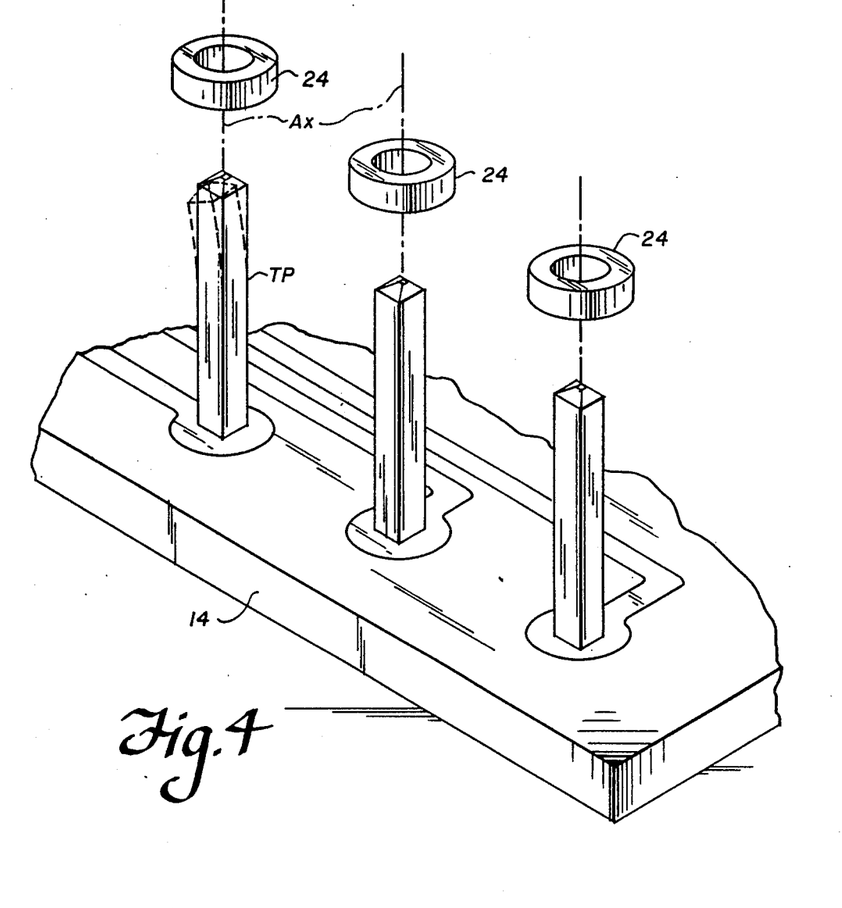
FIG. 4 is a detail perspective view of a plurality of terminal pins with respective annular solder preforms positioned above the pins.
Figure 5:
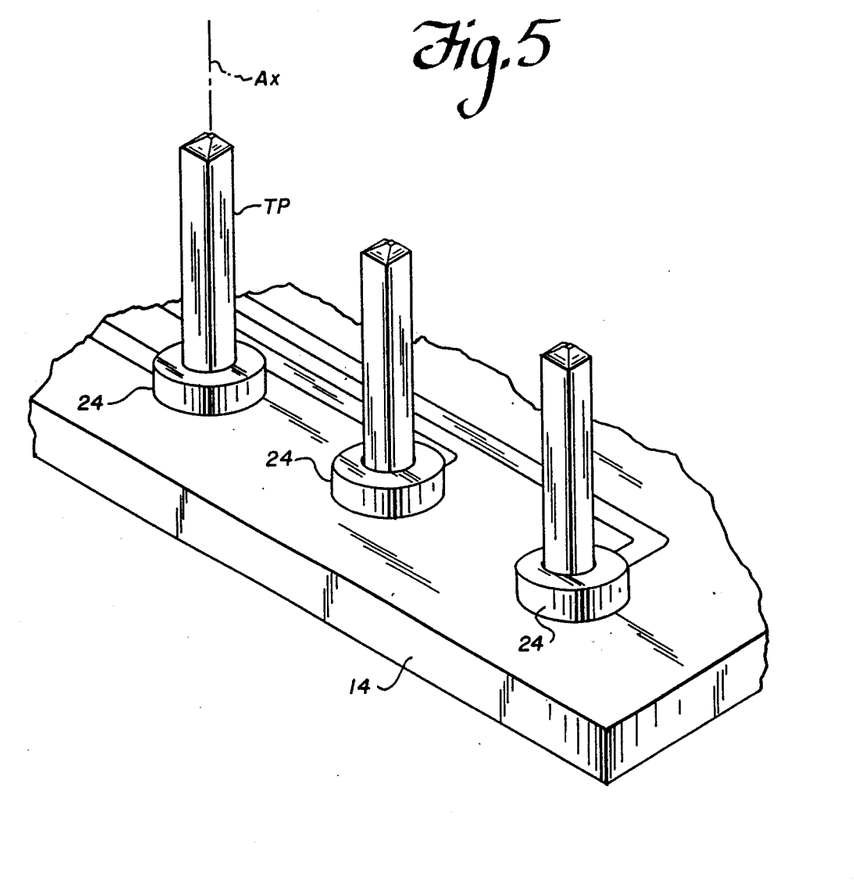
FIG. 5 is a detail view, similar to that shown in FIG. 4, with the annular solder preforms shown installed on their respective terminal pins.

As shown in FIG. 3, the double-sided mounting 10 of FIGS. 1 and 2 is effected by providing the header 12 with pins P having upwardly extending terminal or 'tail' portions TP of selected length. In general, the pins P are securely staked into their assembled position within the housing that defines the header 12. The printed circuit board 14 is provided with clearance bores 20 that correspond in number and organization with the terminal portions TP. The header 12 is assembled to the lower side of the printed circuit board 14 by passing the various terminal portions TP through their corresponding bores 20 until the header 12 fully engages the printed circuit board 14. The soldered connections 22 can be made by hand-soldering or, as is typical in automated assembly operations, by placing an annular solder preform 24 on each terminal portion TP. As shown in FIGS. 4 and 5, each solder perform 24 is formed as an annular ring having an inside diameter and a selected outside diameter, the inside diameter sufficiently large to define a clearance bore relative to its terminal portion TP. In general, the solder preforms 24 are aligned with and slid over their respective terminal portion TP and seated in position on the surface of the printed circuit board 14 at the base of the terminal portion TP, as shown in FIG. 5. Once the solder preforms 24 have been mounted on each of the terminal portions TP, the electrical connection between the terminal portions TP and their respective conductive traces is accomplished by vapor phase reflow soldering, for example. After the soldering step is completed, the shroud, i.e., the housing portion of the header 16, is mated to the upwardly extending field of terminal portions TP to define the header 16. In the preferred embodiment, the pins P have a rectangular cross section with a side dimension of 0.019 inches, and the solder preforms 24 have an inside diameter of about 0.029 inches.

In automatic assembly systems, the solder preforms can be assembled, for example, to their terminal portions TP by providing a horizontally aligned tray having a hole pattern that corresponds in number and arrangement with the terminal portions TP of the header 12. The tray is provided with a rim or fence so that solder preforms 24 can be arrayed in a side-by-side relationship so that a solder preform 24 will be positioned over each hole in the tray in a substantially coaxial manner. The header 12 is assembled to the printed circuit board 14 and the assembled parts positioned so that the terminal portions TP are aligned with the arrayed solder preforms 24 and the terminal portions TP then passed through the solder preforms 24 and the holes in the tray. Thereafter, the header 12 and the tray are inverted and the tray removed to provide a solder preform 24 on each of the terminal portions TP. It is not uncommon for one or more terminal portions TP to be bent or otherwise skewed relative to its intended alignment axis $A_x$, as represented in dotted line illustration by the leftmost terminal portion TP in FIG. 4. In such a situation, the distal end of the mis-aligned terminal portion TP can contact and slide along the inside diameter surface of the solder preform 24 with the relatively soft lead/tin ally transferred or deposited onto the surface of the terminal portions TP. The presence of solder traces on a single terminal portion TP in an array of several hundred terminal portions TP represents an unacceptable condition. In a worst case situation, the solder preform 24 can be impaled upon the tip of a bent or skewed terminal portion TP.

Figure 6:
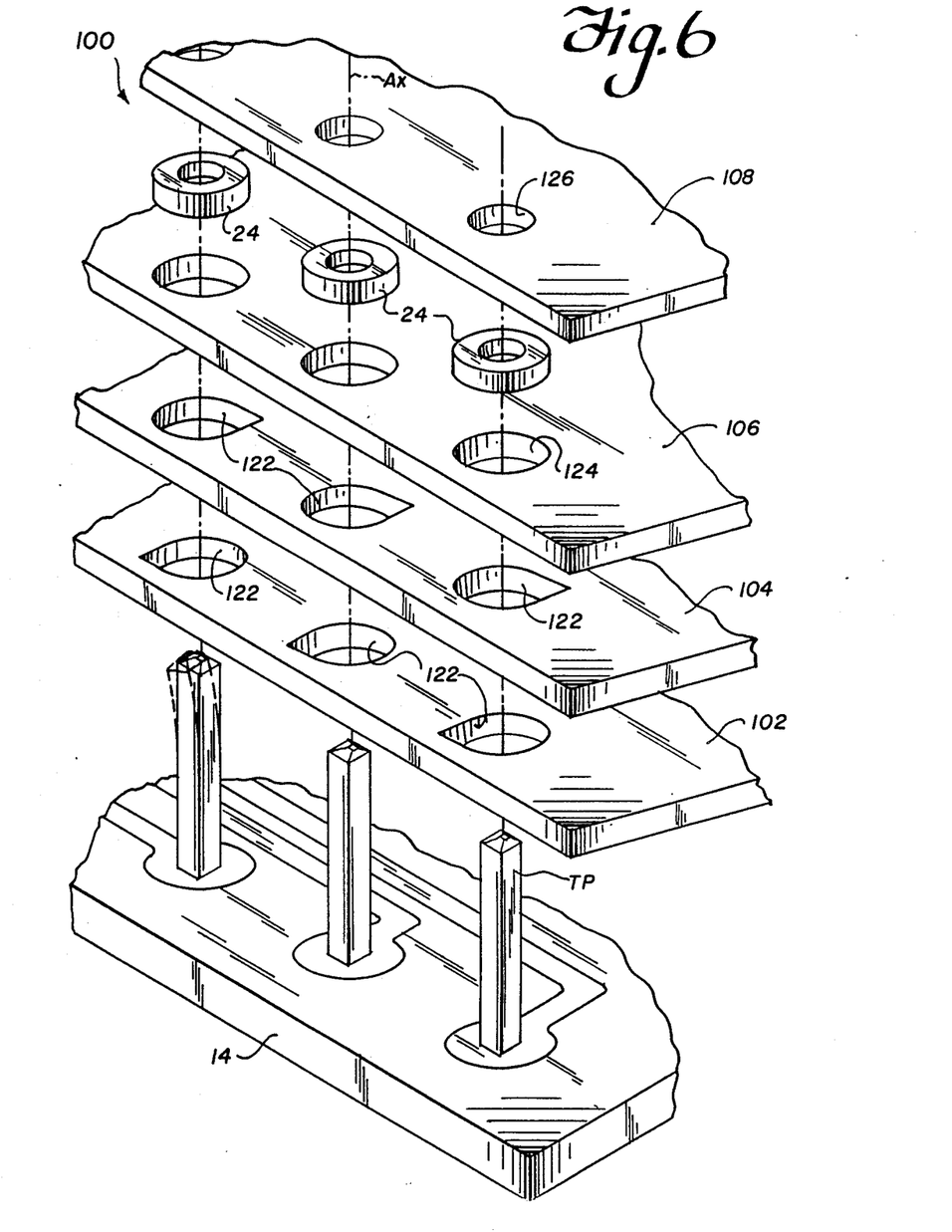
FIG. 6 is an enlarged view, in exploded perspective, of a pin alignment and solder preform installation apparatus in accordance with the present invention.

In accordance with the present invention, an apparatus and method is provided to pre-align all the terminal portions TP into their intended position and reliably install a solder preform 24 upon each terminal portion TP without compromising the integrity of the conductive surface of the terminal portions TP. As shown in the exploded perspective of FIG. 6 and the partial assembly view of FIG. 7, a pin alignment and component installation apparatus in accordance with the present invention is designated generally by the reference character 100 and includes a first slidably mounted jaw plate 102, a second slidably mounted jaw plate 104 overlying the jaw plate 102, a preform carrier 106 overlying the jaw plate 104, and a cover plate 108 overlying the preform carrier 106. As explained in more detail below, the pin alignment and component installation apparatus 100 is designed to mate with a field of terminal portions TP extending from a printed circuit board 14, align all the terminal portions TP into an intended alignment, and place a solder preform 24 onto each of the terminal portions TP.

Figure 7:
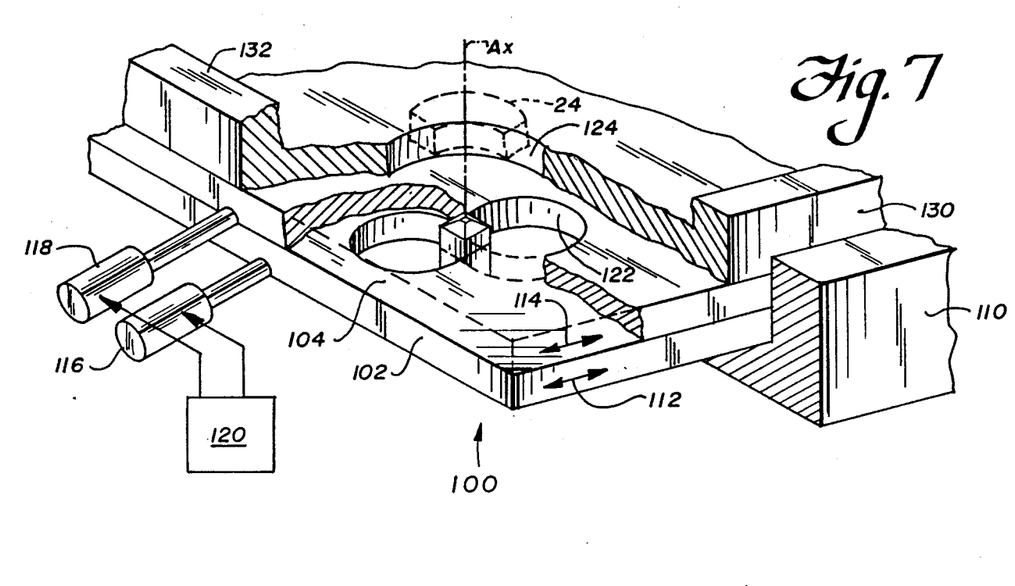
FIG. 7 is an enlarged perspective view of the assembled pin alignment and solder preform installation apparatus with selected portions broken away.
Figure 8:
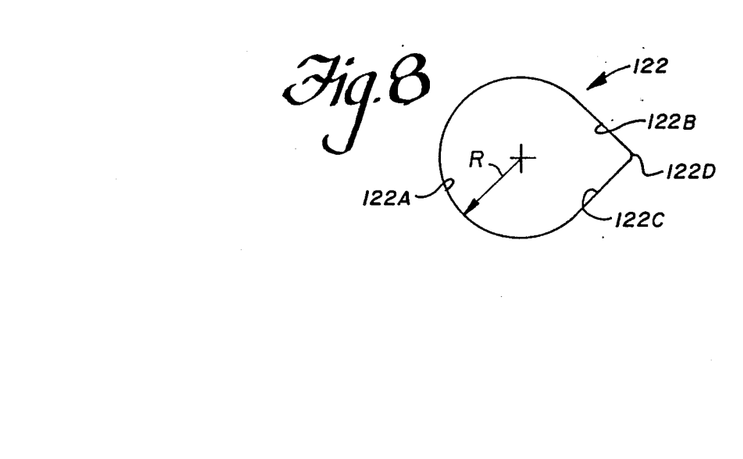
FIG. 8 is a plan view showing the configuration of a pin engaging aperture formed in jaw plates of the apparatus shown in FIG. 6, the aperture suitable for engaging square-sided terminal pins.
Figure 8A:
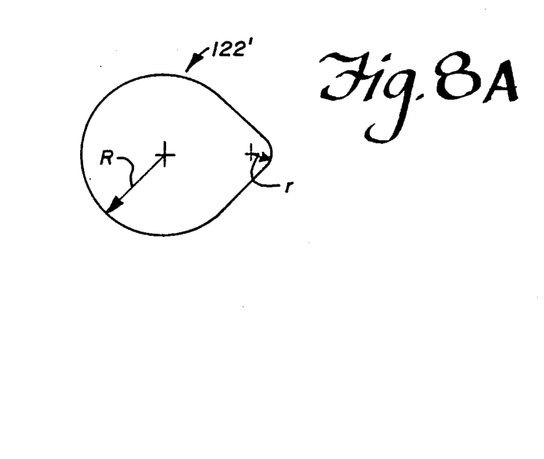
FIG. 8A is a plan view showing the configuration of an alternate pin engaging aperture suitable for engaging cylindrical terminal pins.

The jaw plates 102 and 104 are mounted, as shown in FIG. 7, one atop the other in a guideway 110 for bidirectional sliding movement in the directions indicated by the arrows 112 and 114. The jaw plates 102 and 104 can be moved, for example, by schematically represented actuators 116 and 118, such as pneumatic or electrical actuators, in response to commands provided by a controller 120. In the alternative, the jaw plates 102 and 104 can be moved manually. The jaw plates 102 and 104 have an overall length and width co-extensive with the field of terminal portions TP for which alignment and installation of the solder preforms 24 is to be effected. Each of the jaw plates 102 and 104 is provided with an array of apertures 122 corresponding in number and position with the number and position of the terminal portions TP. As shown in the detail of FIG. 8, each aperture 122 includes a partial circular portion 122A formed at a radius "R" that is somewhat larger than the outside diameter of the solder preform 24. The apertures 122 are elongated to include a first and second linear segments 122B and 122C that are generally tangential to the circular portion 122A and intersect at a radiused corner 122D. In the preferred embodiment, the intersecting segment configuration of the apertures 122 of FIG. 8 is preferable because of the disclosed rectangular cross-section pins P. Where pins P having another cross-sectional configurations are used, for example, cylindrical pins, the apertures 122 are suitably modified. For example and as shown in FIG. 8A, an aperture 122' intended for use with cylindrical pins P includes a partial circular portion formed at a radius "R" that is somewhat larger than the outside diameter of the solder preform 24 and is elongated to include a second partial circular portion formed at a radius "r" that is somewhat larger than the diameter of the cylindrical pin for that application.

The preform carrier 106 is formed as a flat plate having apertures 124 corresponding in number and position with the number and position of the terminal portions TP. In the preferred embodiment, the apertures 124 are circular and formed at a diameter that is somewhat larger in the circular solder preform 24. The cover plate 108, in an analogous manner, is formed as a flat plate with apertures 126 corresponding in number and position with the number and position of the terminal portions TP. In the preferred embodiment, the apertures 126 are circular and formed at a diameter that is somewhat larger than the major dimension of the terminal portions TP but less than the outside diameter of the solder preforms 24. As explained below, the cover plate 108 retains the solder preforms 24 in position in the preform carrier 106 during alignment of the terminal portions TP and the installation of the solder preforms 24.

Figure 9:
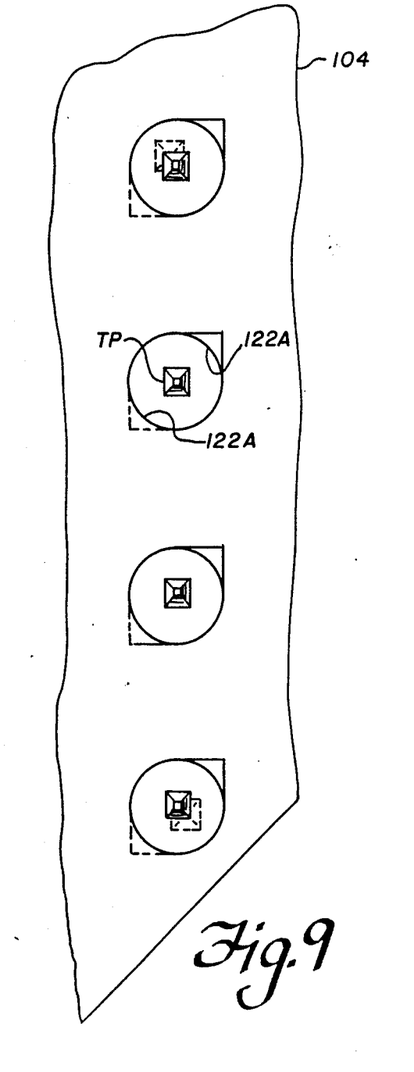
FIG. 9 is a plan view of the jaw plates shown in FIG. 6 in a first, open position.
Figure 9A:
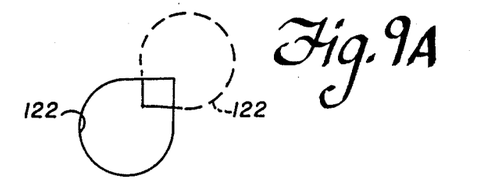
FIG. 9A is a plan view, similar to that shown in FIG. 9, of the jaw plates in an intermediate position.
Figure 10:
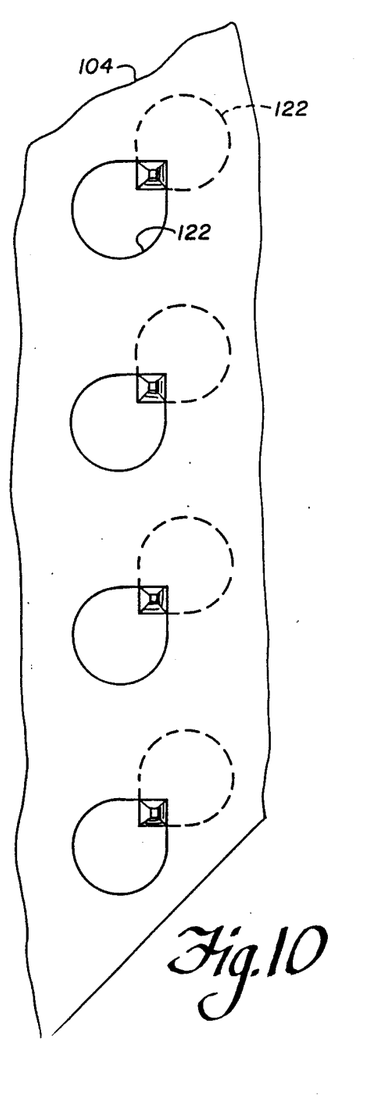
FIG. 10 is a plan view, similar to that shown in FIGS. 9, showing the jaw plates in a closed position.

The jaw plates 102 and 104 are movably between a first, open position, a second, closed position, and at least one intermediate position between the open and closed positions. The jaw plates 102 and 104 are shown in their open position in FIG. 9 positioned above a column of four terminal portions TP, and, as shown, the jaw plates 102 and 104 are moved so that their respective partial circular portions 122A are substantially concentric with one another. Since the partial circular portions 122A of the apertures 122 are formed at a radius "R" that is larger than the outside diameter of a solder preform 24, the opening represents a clearance throughbore relative to the solder preform 24. As indicated in dotted line illustration at the top and bottom of FIG. 9, the opening defined by the jaw plates 102 and 104 in their open position is sufficiently large to accommodate the expected range of mis-aligned, bent, or skewed terminal portions TP. The jaw plates 102 and 104 are shown in their closed position in FIG. 10 above the column of four terminal portions TP, and, as shown, the jaw plates 102 and 104 are moved so that their respective first and second segments 122B and 122C define a substantially rectangular opening sized to substantially embrace or capture the associated terminal portion TP. As can be appreciated, any mis-aligned terminal portions TP will be pulled into proper alignment with their respective axis $A_x$. In general, the sides of the rectangular opening defined by the jaw plates 102 and 104 in the closed position do not clamp the sides of the terminal portions TP and the radiused intersection 122D causes the linear surfaces 122B and 122C to stand off the surfaces of the jaw plates, i.e., a small clearance dimension is defined relative to the surfaces of the terminal portion TP. An exemplary intermediate position for the jaw plates 102 and 104 is shown in FIG. 9A with the jaw plates 102 and 104 positioned to define a generally rectangular opening that is larger than the cross-section of the terminal portions TP so that all the terminal portions TP will extend through the so-formed openings, including terminal portions TP that may be bent or skewed relative to their intended position. As can h=appreciated, various intermediate positions are available with the preferred position sufficiently large to accommodate the expected range of skewed terminal portions TP while small enough to block passage of a solder preform 24 from the overlying preform carrier 106. Each jaw plates 102 and 104 thus includes fixed-sized apertures that cooperate to provide a plurality of variable-size openings that can be varied in size, i.e., enlarged or contracted, to assist in aligning and constraining the terminal portions TP as well as controlling the solder preforms 24.

As explained below in detail, the pin alignment and component installation apparatus 100 of the present invention functions to effect pin alignment and installation of the solder preforms 24 by moving the jaw plates 102 and 104 to their intermediate positions, filling each aperture 124 in the preform carrier 106 with a solder preform 24 and then mating the pin alignment apparatus with the exposed terminal portions TP. As in initial starting position, the jaw plates 102 and 104 are positioned to the intermediate position (FIG. 9A) to define a composite opening that is smaller than the outside diameter of the solder preform 24. A solder preform 24 is loaded into each aperture 124 of the preform carrier 106, for example, by providing a rim or fence, indicated generally by the reference characters 130 and 132 in FIG. 7, with the rims 130 and 132 positioned so that an array of solder preforms 24 in a side-by-side relationship, when swept onto the upper surface of the preform carrier 106, will be constrained by the rims 130 and 132 so that a solder preform 24 will be located over and drop into each aperture 124 of the preform carrier 106. An oversupply of solder preforms 24 can be placed on the preform carrier 106 and moved about manually using a brush or, in a more automated environment, the preform carrier 106 can be inclined slightly relative to the horizontal and subject to a vibration force so that the solder preforms 24 will migrate toward the lower end with selected solder preforms 24 falling into and filling the apertures 124 of the preform carrier 106. The excess solder preforms 24 are removed and the cover plate 108 is placed over the preform carrier 106 so that the solder preforms 24 are retained in their respective apertures 124 on the upper side by the cover plate 108 and on the lower side by the jaw plate 104.

Figure 11:
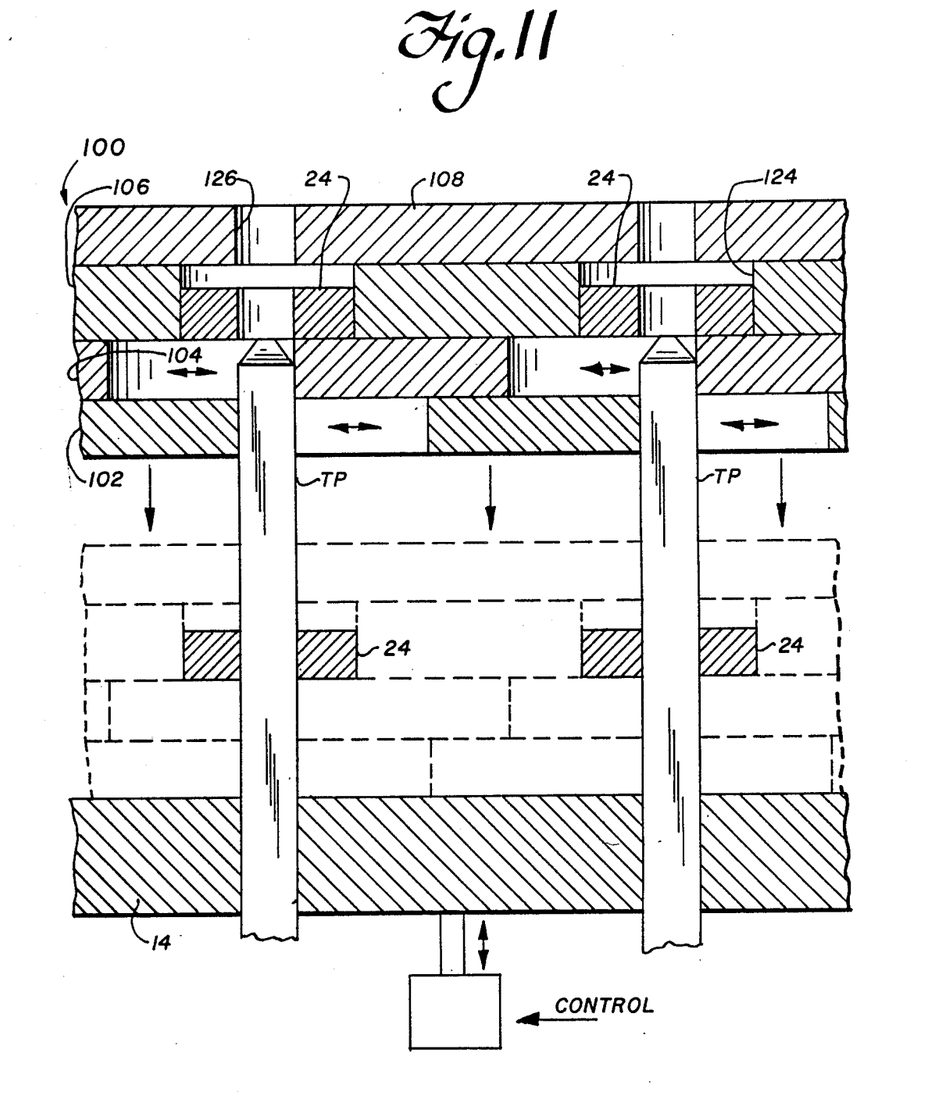
FIG. 11 is a side elevational view, in cross-section, of the pin alignment and solder preform installation apparatus in engagement with selected terminal pins.

As shown in the enlarged detail of FIG. 11, the pin alignment and component installation apparatus 100 is positioned over the tips of the terminal portions TP extending upwardly from the printed circuit board 14 so that the tips of the terminal portions TP pass through the intermediate size openings (FIG. 9A) defined by the jaw plates 102 and 104. Since the possibility exists that one or more terminal portions TP may be mis-aligned relative to their intended position, the initial placement of the pin alignment and installation apparatus 100 is such that the remote ends of the terminal portions TP do not extend into or through the interior opening of the solder preforms 24, as shown in FIG. 11. The jaw plates 102 and 104 are then moved to the closed position shown in FIG. 10. As shown, the jaw plates 102 and 104 are moved so that their respective first and second segments 122B and 122C define a substantially rectangular opening sized to substantially embrace or capture the tip of the associated terminal portion TP. In general, the sides of the rectangular opening do not clamp the sides of the terminal portions TP and a small clearance dimension is provided between the surfaces with the radiused corner 122D of the opening contacting a corner of the terminal portion TP. Where a terminal portion TP is bent or skewed relative to its intended position, the jaw plates 102 and 104 are effective to move the mis-aligned terminal portion TP into a proper alignment relative to its intended axis $A_x$.

Thereafter, the pin alignment and installation apparatus 100 or the header 12 and printed circuit board 14 assembly (or both) are moved so that the pin alignment and installation apparatus 100 advances toward the printed circuit board 14. Since the terminal portions TP are constrained by the closed jaw plates 102 and 104, the terminal portions TP will pass through their respective solder preform 24 without under surface-to-surface contact. Since each solder preform 24 is restrained within the cavity defined by the aperture 124 of the preform carrier 106, the cover plate 108, and the jaw plate 102, the solder preform 24 will advance down its terminal portion TP until the pin alignment and installation apparatus 100 seats against the upper surface of the printed circuit board 14, as shown in dotted line illustration in FIG. 11. In this latter position, the solder preform 24 will be held above the printed circuit board 14 by the combined thickness of the jaw plates 102 and 104. After the pin alignment and installation apparatus 100 has moved to its dotted line position, the jaw plates 102 and 104 are moved to their open position (FIG. 9) to define a circular opening larger than the outside diameter of the solder preform 24 and thus allow each solder preform 24 to drop to the surface of the printed circuit board 14. After the solder preform 24 are installed, the pin alignment and installation apparatus 100 is separated from the header 12 and printed circuit board 14 assembly. The header 12 and printed circuit board 14 assembly is then ready for the solder reflow operation by which the terminal portions TP are electrically connected to their circuit traces.

The apparatus and method of the present invention advantageously provides for the alignment of the terminal portions of a header or connector and the reliable and efficient installation of solder preforms in such a way that the possibility of depositing solder traces on the terminal portions is minimized.

While the present invention has been described in the context of a header and printed circuit board assembly, as can be appreciated, the present invention can be used in the context of a connector and printed circuit board assembly as well as applications in which a field of terminal pins are staked to a printed circuit board.

As will be apparent to those skilled in the art, various changes and modifications may be made to the illustrated pin alignment apparatus and method of the present invention without departing from the spirit and scope of the invention as determined in the appended claims and their legal equivalent.

What is claimed is:

1. A method for aligning terminal pins in a pin field and for installing a solder preform onto the aligned pins, the method comprising the steps of:
    mating the tips of a plurality of pins in a field in jaw plate assembly having a plurality of openings, the size of each of said openings being variable, controlling the size of the openings from a first size to a second size thereby constraining the pins to a selected predetermined alignment;
    placing a solder preform over each so-aligned pin;
    advancing the jaw plate assembly and solder preform in the direction of a proximate, base end of the pin; and
    withdrawing the jaw plate assembly to thus install the solder preform onto the pin.

* * * * *